United States Patent
Lee et al.

[11] Patent Number: 6,088,284
[45] Date of Patent: Jul. 11, 2000

[54] MEMORY CHIP HAVING MULTIPLE INPUT/OUTPUT SYSTEM

[75] Inventors: Jung-Yong Lee, Seoul; Joon-Ho Na, Cheongju, both of Rep. of Korea

[73] Assignee: LG Semicon Co., Ltd., Cheongju, Rep. of Korea

[21] Appl. No.: 09/239,780

[22] Filed: Jan. 29, 1999

[30] Foreign Application Priority Data

Jan. 31, 1998 [KR] Rep. of Korea ......................... 98/2671

[51] Int. Cl.[7] ........................................................ G11C 8/00
[52] U.S. Cl. .................................. 365/230.03; 365/230.06
[58] Field of Search ............................ 365/230.03, 225.7, 365/230.06, 189.04, 189.05

[56] References Cited

U.S. PATENT DOCUMENTS

| | | | |
|---|---|---|---|
| 5,262,990 | 11/1993 | Mills et al. | 365/189.02 |
| 5,305,278 | 4/1994 | Inoue | 365/230.03 |
| 5,629,900 | 6/1997 | Hirose et al. | 365/230.03 |

Primary Examiner—David Nelms
Assistant Examiner—David Lam
Attorney, Agent, or Firm—Fleshner & Kim, LLP

[57] ABSTRACT

A memory chip having a multiple input/output system enables a memory to have a ×n, ×2n or ×4n I/O system through a simple fuse mask process by using a single memory chip and reduces the consumption of a cell current while having a memory capacity which is the same as in the ×n or ×2n I/O system of the conventional art. The multiple input/output memory chip according to the present invention includes a block selecting unit for receiving a source voltage or a column address lowest bit and thereby selectively activating a first block selection signal or a second block selection signal, a column control unit for receiving a source voltage or a column address lowest bit and thereby selectively activating a first column control signal or a second column control signal, a first bank for simultaneously reading or writing n-bit or 2n-bit data in accordance with the first or second column control signal and the first block selection signal, a second bank for simultaneously reading or writing n-bit or 2n-bit data in accordance with the first or second column control signal and the second block selection signal, and a data bus which is connected with first to third fuses and thereby dividable up to four parts.

22 Claims, 3 Drawing Sheets

FIG. 3
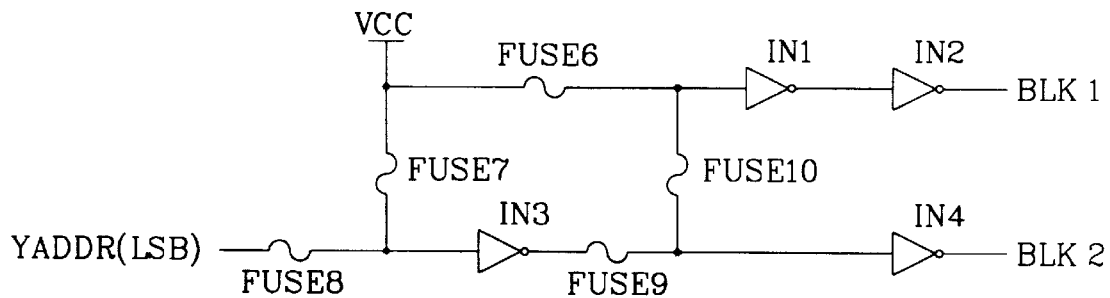
FIG. 4
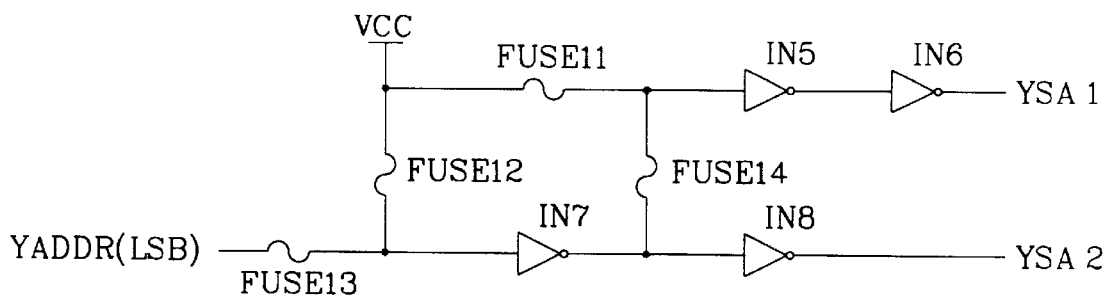
FIG. 5
| PRIOR ART | | | | PRESENT INVENTION | | | | |
|---|---|---|---|---|---|---|---|---|
| SIZE | ADDRESS DIN | X | Y | SIZE | ADDRESS DIN | X | Y | Y(LSB) |
| 4K × 8 | 12 | 9 | 3 | 4K × 8 | 12 | 9 | 2 | 1 |
| 4K × 16 | 12 | 9 | 3 | 4K × 16 | 12 | 9 | 2 | 1 |
| — | — | — | — | 2K × 32 | 11 | 9 | 2 | — |

MEMORY CHIP HAVING MULTIPLE INPUT/OUTPUT SYSTEM

BACKGROUND OF THE INVENTION

1. Field of the Invention

The present invention relates to a semiconductor memory chip, and more particularly to a memory chip having a multiple inputs/output system.

2. Description of the Conventional Art

Generally, a conventional multiple input/output memory chip is fabricated by dividing a memory cell into unit blocks, each being capable of inputting/outputting 8-bit data. Also, the conventional multiple input/output memory chip is used by expanding an entire memory to a memory having an 8, 16 or 32-bit input/output by enabling one unit block or a plurality of unit blocks in accordance with a predetermined signal.

FIG. 1 illustrates an example of the conventional multiple input/output memory chip using ×8 or ×16 bit which has a 32K or 64K memory capacity.

As shown therein, there are mainly a first memory block BLOCK1 which simultaneously inputs/outputs 8-bit data by decoding an address signal in accordance with a first block selection signal BLK1 and thus enabling a corresponding memory cell and a second memory block BLOCK2 which simultaneously inputs and outputs 8-bit data by decoding an address signal in accordance with a second block selection signal BLK2 and thus enabling a corresponding memory cell.

In such way, one memory chip is divided into two unit blocks which enable the input/output of the 8-bit data. Then, when using ×8 bit, only the first block BLOCK1 operates by activating the first block selection signal BLK1, while when using ×16 bit, both of the first and second blocks BLOCK1, BLOCK2 operate by activating the first and second block selection signals BLK1, BLK2. Accordingly, it is possible to use one memory chip as memories of 4K×8 size and 4K×16 size, thus considerably reducing the costs for separately fabricating memory chips.

More particularly, the first memory block BLOCK1 includes a first memory cell array 10 consisting of 512 word lines (rows) and 64 bit lines (columns), a first row decoder 11 for decoding a 9-bit row address signal XADDR in accordance with a first block selection signal BLK1, a first word line driving unit 12 for driving a word line among the 512 word lines in accordance with the decoded address signal, a first column selecting unit 13 for selecting 8 among the 64 bit lines of the first memory cell array 10 in accordance with a 3-bit column address signal YADDR, a first sense amp unit 14 for amplifying the data of the 8 memory cells which have been selected by the first word line driving unit 12 and the first column selecting unit 13 to a predetermined size, a first sense amp driving unit 15 for driving the first sense amp unit 14 in accordance with the first block selection signal BLK1 and a first data input/output unit 16 for input/outputting 8-bit data through a data bus DB1.

The second memory block BLOCK2 which has the same configuration with the first memory block BLOCK1 includes a second memory cell array 10', a second row decoder 11', a second word line driving unit 12', a second column selecting unit 13', a second sense amp unit 14', a second sense amp driving unit 15' and a second data input/output unit 16. Here, each of the first and second column selecting unit 13, 13' consists of 8 column selects (C/S), 8 columns per each C/S, and each of the first and second sense amp units 14, 14' includes 8 sense amps, through which 8-bit data may be simultaneously inputted/outputted.

When such multiple input/output memory chip has the input/output (I/O) system using ×8 bit, only the first memory block BLOCK1 operates by activating the first block selecting signal BLK1 and disabling the second block selecting signal BLK2. The row decoder 11 which received the first block selection signal BLK1 is enabled and thus decodes and outputs the inputted 9-bit row address signal XADDR. Then, the first word line driving unit 12 which received the address signal decoded by the first row decoder 11 drives a corresponding word line among the 512 word lines of the first memory cell array 10, and in accordance with the 3-bit column address YADDR the 8 C/Ss of the first column selection unit 13 respectively select each bit line among 8 bit lines connected with each C/S, thus total selecting 8 memory cells.

While, the first sense amp driving unit 15 enabled by receiving the first block selection signal BLK1 drives 8 sense amps of the first sense amp unit 14, for thereby amplifying data stored in the selected 8 memory cells and outputting the data through the data bus DB1 or storing the data in the memory cells. Then, the first data input/output unit 16 externally outputs the data which have applied through the data bus DB1. Such process implements the 4K×8 memory by operating only the first memory block BLOCK1, and both of the first and second block selection signals BLK1, BLK2 are activated for using the conventional multiple input/output memory chip as the 4K×16 memory. Then, the first memory block BLOCK1 operates the same as the above-described 4K×8 memory and also the second memory block BLOCK2 has the same operation as in the first block BLOCK1.

In other words, if the second row decoder 11' which received the second block selection signal BLK2 decodes and outputs an enabled 9-bit row address signal XADDR, the second word line driving unit 12' which received the decoded address signal drives one corresponding word line among the 512 word lines of the second memory cell array 10', and in accordance with the 3-bit column address YADDR the 8 C/Ss in the second column selection unit 13' select each bit line of the 8 columns connected with each C/S, thus selecting 8 memory cells.

The second sense amp driving unit 15' which received the second block selection signal BLK2 is enabled and drives the 8 sense amps of the second sense amp unit 14' for thereby amplifying the data stored in the selected 8 memory cells and loading the resultant data into the data bus DB2. Thus, the second data input/output unit 16' externally outputs the 8-bit data loaded in the data bus DB2.

In the above-described process, 8-bit data are inputted/outputted in the first and second memory blocks BLOCK1, BLOCK2, respectively and thus it is possible for 16-bit data to be simultaneously inputted/outputted.

However, since the two memory blocks BLOCK1, BLOCK2 should be simultaneously enabled at all times in order to use the memory circuit having the conventional multiple input/output system as the memory using ×16 bit, the operation current of the cell twice multiplies, thus making an unstable condition of the whole memory. In addition, it is required to inconveniently connect the couple of the memory chips to use the memory circuit as the memory using ×32 bit.

SUMMARY OF THE INVENTION

Accordingly, the present invention is directed to a multiple input/output memory circuit which obviates the problems and disadvantages due to the conventional art.

An object of the present invention is to provide a multiple input/output memory circuit that decreases an operation current of a cell with no change of the memory capacity or the number of address pins.

Another object of the present invention is to provide a multiple input/output memory circuit that simply achieves a ×8, ×16 or ×32 I/O system using a single memory chip with the change of only a fuse mask.

To achieve these and other advantages and in accordance with the purpose of the present invention, as embodied and broadly described, a multiple input/output memory circuit includes a block selecting unit for receiving a source voltage or a column address lowest bit and thereby selectively activating a first block selection signal or a second block selection signal, a column control unit for receiving a source voltage or a column address lowest bit and thereby selectively activating a first column control signal or a second column control signal, a first bank for simultaneously reading or writing n-bit or 2n-bit data in accordance with the first or second column control signal and the first block selection signal, a second bank for simultaneously reading or writing n-bit or 2n-bit data in accordance with the first or second column control signal and the second block selection signal, and a data bus which is connected with first to third fuses and thereby dividable up to four parts.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a circuit diagram detailedly illustrating a block selecting unit of FIG. 2;

FIG. 4 is a circuit diagram detailedly illustrating a column control unit of FIG. 2; and FIG. 5 is a table comparing the embodiment of the present invention to the conventional art.

DETAILED DESCRIPTION OF THE INVENTION

Reference will now be made in detail to the preferred embodiment of the present invention, examples of which are illustrated in the accompanying drawings.

Figure 1:
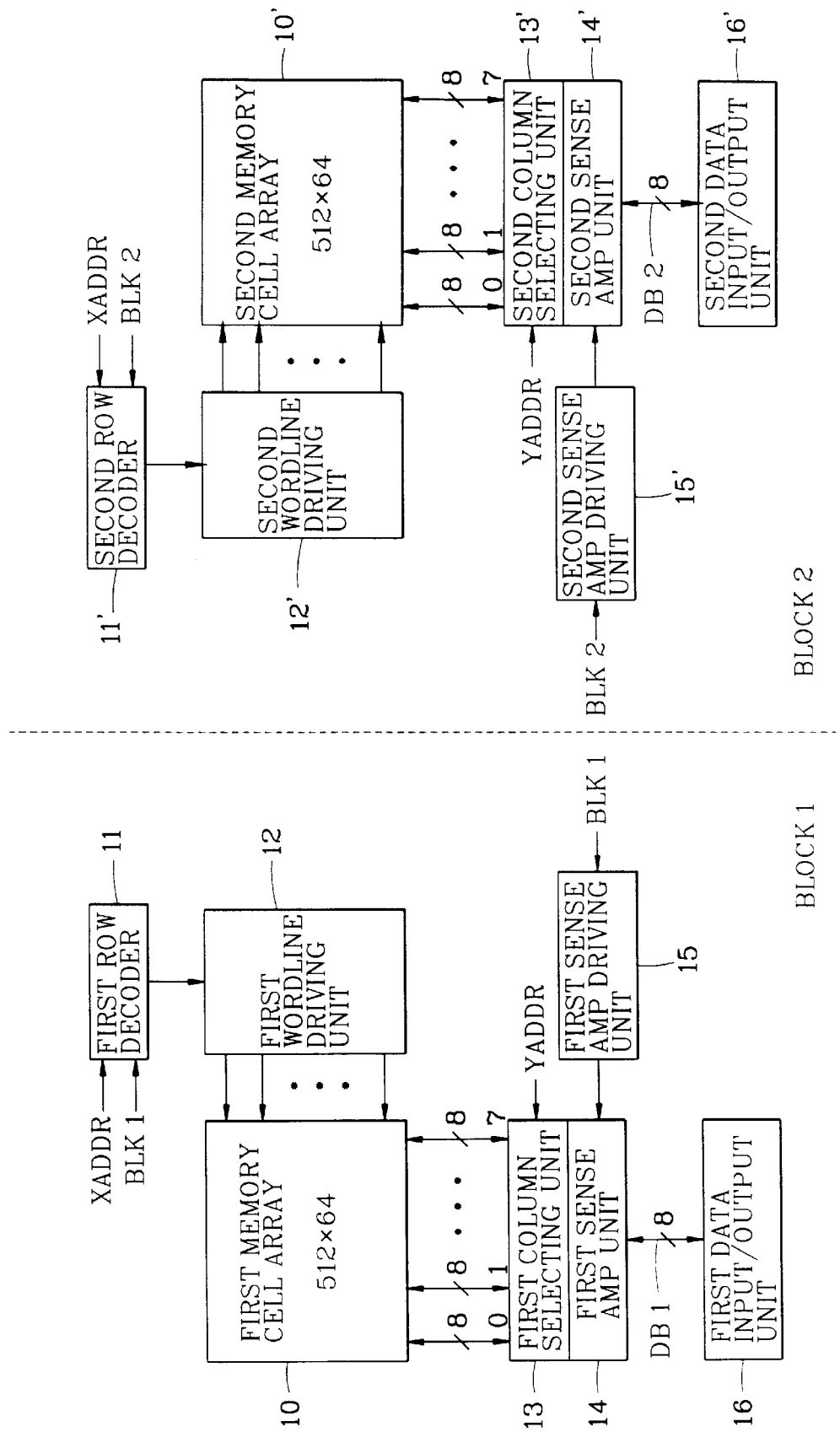
FIG. 1 is a block diagram illustrating an example of a conventional multiple input/output memory having a ×8 or ×16 I/O system.
Figure 2:
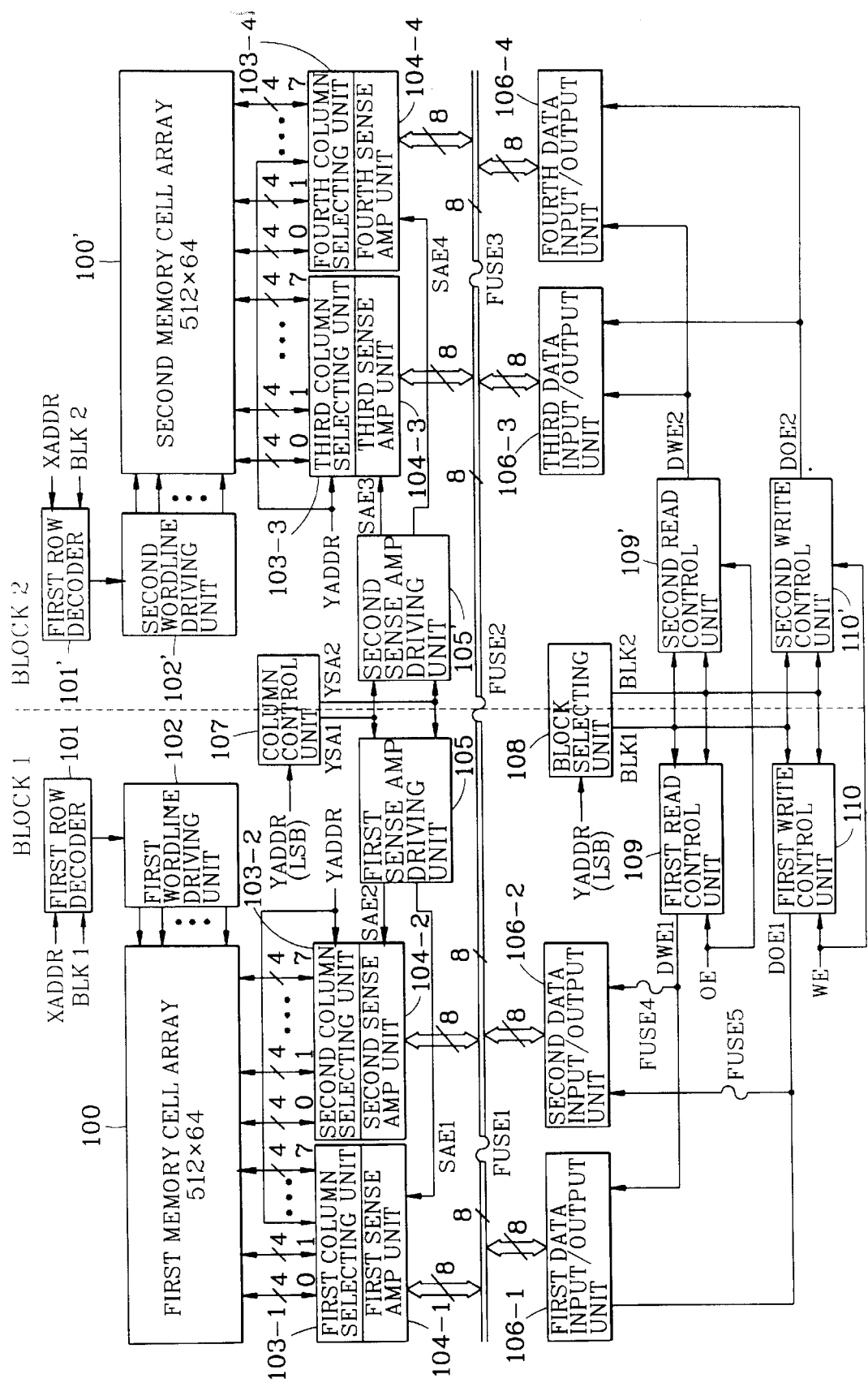
FIG. 2 is a block diagram illustrating a multiple input/output memory having a ×8, ×16 or ×32 I/O system according to an embodiment of the present invention.

First, in FIG. 2, the multiple input/output memory circuit according to an embodiment of the present invention is provided with a column control unit 107 for selectively outputting a first YSA1 or a second sense amp control signal YSA2 by receiving a lowest bit LSB of a column address signal YADDR, a block selecting unit 108 for selectively outputting a first BLK1 or second block selection signal BLK2 by receiving the lowest bit LSB of the column address signal YADDR, a first memory block BLOCK1 for simultaneously reading or writing 8-bit or 16-bit data in accordance with the first YSA1 or the second sense amp control signal YSA2 and the first block selection signal BLK1, a second memory block BLOCK2 for simultaneously reading or writing 8-bit or 16-bit data in accordance with the first YSA1 or the second sense amp control signal YSA2 and the second block selection signal BLK2 and a data bus DB which is dividable into four parts and connected with first to third fuses Fuse1–Fuse3 for thereby simultaneously loading 8, 16 or 32-bit data.

Here, it is noted that the column control unit 107 selectively activates the first sense amp control signal YSA1 or the second sense amp control signal YSA2 in accordance with the lowest bit of the column address signal YADDR (LSB) in case of using ×8 bit, and activates all of the first and second sense amp control signals YSA1, YSA2 at all times in case of using ×16 or ×32 bit. While, the block selecting unit 108 always activates only the first block selection signal BLK1 when using ×8 bit, selectively activates the first block selection signal BLK1 or the second block selection signal BLK2 in case of using ×16 bit, and activates all of the first and second block selection signals BLK1, BLK2 in case of using ×32 bit at all times.

Further, the first memory block BLOCK1 includes a first memory cell array 100 consisting of 512 word lines and 64 bit lines, a first row decoder 101 for decoding a 9-bit row address signal XADDR in accordance with the first block selection signal BLK1, a first word line driving unit 102 for receiving the decoded address signal and thus driving a corresponding word line among the 512 word lines of the first memory cell array 100, a first and second column selecting units 103-1, 103-2, each consisting of 8 C/Ss, each connected with 4 columns of the first memory cell array 100, for respectively receiving a 2-bit column address signal YADDR and selecting one of the 4 bit lines connected with each C/S, thereby total selecting 8 bit lines, a first sense amp unit 104-1 for amplifying data of the 8 data of the corresponding memory cell, selected by the first word line driving unit 102 and the first column selecting unit 103-1, to a predetermined size, a second sense amp unit 104-2 for amplifying data of the 8 data of the corresponding memory cell, selected by the first word line driving unit 102 and the second column selecting unit 103-2, to a predetermined size, a first sense amp driving unit 105 for driving the first 104-1 or the second sense amp unit 104-2 in accordance with the first YSA1 or the second sense amp control signal YSA2 of the column control unit 107, first and second data input/output units 106-1, 106-2 for respectively performing inputting/outputting 8-bit data through the data bus DB, a first read control unit 109 for applying a first data output signal DOE1 to the first and the second data input/output units 106-1, 106-2, respectively, in accordance with the first block selection signal BLK1 of the block selecting unit 108 and an output enable signal OE during the reading operation, a first write control unit 110 for applying a first data input signal DWE1 to the first and second data input/output units 106-1, 186-2, respectively, in accordance with the first block selection signal BLK of the block selecting unit 108 and a write enable signal WE during the writing operation, fourth and fifth fuses Fuse4, Fuse5 for cutting off a data output signal DOE1 and a data input signal DWE1 which are applied to the second data input/output unit 106-2 in case of the ×8 memory.

Further, the second memory block BLOCK2 includes a second memory cell array 100', a second row decoder 101', a second word line driving unit 102', third and fourth column selection units 103-3, 103-4, third and fourth sense amp units 104-3, 104-4, a second sense amp driving unit 105', third and fourth data input/output units 106-3, 106-4, a second read control unit 109' and a second write control unit 110', each block performing the same operation as in the corresponding block of the first memory block BLOCK1.

FIG. 3 is a circuit diagram which detailedly illustrates the block selecting unit 108 is provided with sixth and seventh fuses Fuse6, Fuse7 each of which an end is connected to a source voltage Vcc, first and second inverters IN1, IN2 serially connected with the other end of the sixth fuse Fuse6, an eighth fuse Fuse8 of which an end is connected to the lowest bit of the column address signal YADDR(LSB), a third inverter IN3 commonly connected to the other ends of the seventh and eighth fuses Fuse7, Fuse8, a ninth fuse Fuse9 of which an end is connected to an output side of the third inverter IN3, a fourth inverter IN4 connected to the other end of the ninth fuse Fuse9 and a tenth fuse 10 of which an end is connected to a node between the sixth fuse Fuse6 and the first inverter IN1 and the other end is connected to a node between the ninth fuse Fuse9 and the fourth inverter IN4.

Further, FIG. 4 is a circuit diagram of the column control unit 107. As shown therein, the column control unit 107 consists of eleventh and twelfth fuses Fuse11, Fuse12 each of which an end is connected to the source voltage Vcc, fifth and sixth inverters IN5, IN6 serially connected with the other end of the eleventh fuse Fuse11, a thirteenth fuse Fuse13 of which an end is connected to the lowest bit of the column address signal YADDR(LSB), a seventh inverter IN7 commonly connected to the other ends of the twelfth and thirteenth fuses Fuse12, Fuse13, an eighth inverter IN8 connected to an output side of the seventh inverter IN7, and a fourteenth inverter Fuse14 of which an end is connected to a node between the eleventh fuse Fuse11 and the fifth inverter IN5 and the other end is connected to a node between the seventh inverter IN7 and the eighth inverter IN8.

Here, the first to fourteenth fuses Fuse1–Fuse14 are used by cutting certain fuses with laser in accordance with a ×8, ×16 or ×32 bit memory in the fuse mask process.

Now, the operation of the multiple I/O memory according to the embodiment of the present invention will be described in more detail.

1. Memory using ×8 bit.

The three fuses Fuse1–Fuse3 which divide the data bus DB into the four part are connected, but the fuses Fuse4, Fuse 5 are cut off. While, in the block selecting unit 108, the sixth and tenth fuses Fuse6, Fuse10 are in connection and the seventh, eighth and ninth fuses Fuse7, Fuse8, Fuse9 are cut off, and the thirteenth and fourteenth fuses Fuse13, Fuse14 in the column control unit 107 are in connection and the eleventh and twelfth fuses Fuse11, Fuse12 connected to the source voltage Vcc are cut off.

In the memory circuit of the ×8 I/O system for which the above fuse mask process has been performed, in the block selecting unit 108, a level of the source voltage Vcc is sequentially inverted by the first and second inverters IN1, IN2 through the sixth fuse Fuse6 regardless of the column address signal YADDR (LSB) and thus the first block selection signal BLK1 at a high level is generated, while the source voltage Vss is inverted by the fourth inverter IN4 through the sixth and tenth fuses Fuse6, Fuse10 and thereby the second block selection signal BLK2 at a low level is generated.

Accordingly, when the block selection signal BLK1 at the high level is inputted to the first row decoder 101 of the first memory block BLOCK1, the first row decoder 101 is enabled and decodes the 9-bit row address signal XADDR. While, since the second block selection signal BLK2 at the low level is applied from the block selecting unit 108 to the second row decoder 101' of the second memory block BLOCK2, the second row decoder 101' which is disabled does not operate. The first word line driving unit 102 which received the decoded address signal from the first row decoder 101 drives a corresponding word line of the 512 word lines.

While, when the 2-bit address signal YADDR, except for the lowest bit of the 3-bit column address signal, is applied to the first and second column selecting units 103-1, 103-2, respectively, the first and second column selecting units, each consisting of 8 C/Ss, respectively, select one bit line among 4 bit lines per each C/S. Therefore, each of the first and second column selecting units 103-1, 103-2 selects 8 bit lines.

Further, the lowest bit (LSB) of the column address signal is applied to the column control unit 107. Here, when the lowest bit of the column address signal YADDR(LSB) is '0' (LOW), the column control unit 107 is inverted to the high level through the thirteenth fuse Fuse13 and the seventh inverter IN7, the high-level signal is sequentially inverted by being applied to the fifth and sixth inverters IN5, IN6 through the fourteenth fuse Fuse14, and lastly the first sense amp control signal YSA1 at the high level is generated. Further, the high-level signal passing through the seventh inverter IN7 is inverted again by the eighth inverter IN8 and accordingly the second sense amp control signal YSA2 of the low level is generated.

On the contrary, when the lowest bit of the column address signal YADDR(LSB) is '0', the first sense amp control signal YSA1 becomes the low level and the second sense amp control signal YSA2 becomes the high level. Then, the first and second control signals YSA1, YSA2 are applied from the column control unit 107 to the first sense amp driving unit 105, and the first sense amp driving unit 105 selectively drives the first sense amp unit 104-1 or the second sense amp unit 104-2 in accordance with the states of the inputted control signals YSA1, YSA2. In other words, the first sense amp driving unit 105 generates a first sense amp enable signal SAE1 to thereby enable the first sense amp unit 104-1 when the first sense amp control signal YSA1 inputted from the column control unit 107 is the high level, while the first sense amp driving unit 105 generates a second sense amp enable signal SAE2 to enable the second sense amp unit 104-2 when the first sense amp control signal YSA2 is the high level.

Then, when the first sense amp enable signal SAE1 is inputted from the first sense amp driving unit 105, the first sense amp unit 104-1 amplifies the data stored in the 8 memory cells which are selected by the first word line driving unit 102 and the first column selection unit 103-1 to the predetermined size and outputs the data to the data bus DB. While, when the second sense amp enable signal SAE2 is inputted from the first sense amp driving unit 105, the second sense amp unit 104-2 amplifies the data stored in the 8 memory cells which are selected by the first word line driving unit 102 and the second column selection unit 103-2 to the predetermined size and outputs the data to the data bus DB. That is, the first and second sense amp units 104-1, 104-2 do not simultaneously operate but alternately operate in accordance with the lowest bit of the column address signal YADDR(LSB).

Accordingly, the 8-bit data are loaded in the data bus DB and externally outputted by the first data input/output unit 106-1. It is noted that the first data input/output unit 106-1 performs inputting/outputting the 8-bit data through the data bus DB in accordance with the first data output signal DOE1 of the first read control unit 109 when outputting the data or the first data input signal DWE1 of the first write control unit 110 when inputting the data.

Here, when the first read control unit 109 applies the first data output signal DOE1 to the first and second input/output units 106-1, 106-2, respectively, in accordance with the output enable signal OE and the high-level first block selection signal BLK1, the second data input/output unit 106-2 does not operate since the fourth fuse Fuse4 connected thereto is cut off. Further, when the first write control unit 110 applies the first data input signal DWE1 to the first and second input/output units 106-1, 106-2, respectively, in accordance with the write enable signal WE and the high-level first block selection signal BLK1, the second data input/output unit 106-2 does not operate since the fifth fuse Fuse5 connected thereto is cut off.

As described above, it is possible to use the memory having the 4K×8 capacity with only the first memory block BLOCK1 as in the conventional art by using the embodiment of the present invention as the memory with the ×8 I/O system. Also, the first memory block BLOCK1 is divided into the two sub-blocks which are alternately enabled when necessary in accordance with the lowest bit of the column address signal YADDR(LSB), thus reducing the consumption of the current.

2. Memory using ×16 bit.

For the memory using ×16 bit, the first and third fuses Fuse1, Fuse3 of the data bus DB are cut off, for thereby dividing the data bus DB per each block into two parts, and the fourth and fifth fuses Fuse4, Fuse5 are in the connection. In addition, the eighth, ninth and tenth fuses Fuse8, Fuse9, Fuse10 of the block selecting unit 108 are in connection and the sixth and seventh fuses Fuse6, Fuse7 are cut off, and the eleventh and twelfth fuses Fuse11, Fuse12 in the column control unit 107 are in connection and the thirteenth and fourteenth fuses Fuse13, Fuse14 are cut off.

The memory circuit of the ×16 I/O system for which the above fuse mask process has been performed has the similar operation to the memory circuit of the ×8 I/O system. Therefore, the explanation of the operation which is identical to the memory circuit of the ×8 I/O system will be omitted.

First, in the block selecting unit 108, when the lowest bit of the column address signal YADDR(LSB) is '0', the first block selection signal BLK1 of the high level and the second block selection signal BLK2 of the low level are generated, while when the lowest bit of the column address signal YADDR(LSB) is '1', the first block selection signal BLK1 at the low level and the second block selection signal BLK2 at the high level are generated. Accordingly, in the former case the first memory block BLOCK1 is enabled, while in the latter case the second memory block BLOCK2 is enabled. That is, the two memory blocks BLOCK1, BLOCK2 operate not simultaneously, but alternately.

Further, in the column control unit 107 the source voltage level is applied to the two output terminals thereof, regardless of the lowest bit of the column address signal YADDR (LSB), and thus both of the first and second sense amp control signals YSA1, YSA2 are activated at the high level at all times.

Accordingly, when the first memory block BLOCK1 is enabled, both of the first and second sense amp units 104-1, 104-2 are driven, thereby each simultaneously amplifying 8-bit data, that is total 16-bit data. Simultaneously, when the second memory block BLOCK2 is enabled, both of the third and fourth sense amp units 1043, 104-4 are driven, thereby each amplifying 8-bit data, that is total 16-bit data.

Further, the first and second data input/output units 106-1, 106-2 and the third and fourth data input/output units 106-3, 106-4 are simultaneously enabled, for thereby simultaneously inputting/outputting the 16-bit data.

In the ×16 I/O system according to the embodiment of the present invention, the memory blocks are alternately enabled in accordance with the lowest bit of the column address signal YADDR(LSB) without simultaneously enabling the first and second memory blocks BLOCK1, BLOCK2 with the memory having the 4K×16 capacity, thus having an effect of reducing the waste of the current.

3. Memory using ×32 bit.

For the memory using ×32 bit, the first, second and third fuses Fuse1, Fuse2, Fuse3 of the data bus DB are cut off, for thereby dividing the data bus DB into four parts, and the fourth and fifth fuses Fuse4, Fuse5 are in connection. In addition, the sixth, seventh and ninth fuses Fuse6, Fuse7, Fuse9 of the block selecting unit 108 are in connection and the eighth and tenth fuses Fuse8, Fuse10 are cut off, and the eleventh and twelfth fuses Fuse11, Fuse12 of the column control unit 107 are in connection and the thirteenth and fourteenth fuses Fuse13, Fuse14 are cut off.

In the memory circuit of the ×32 I/O system for which the above fuse mask process has been performed, the source voltage level is applied to the two output terminals of the block selecting unit 108 regardless of the lowest bit of the column address signal YADDR(LSB) and accordingly both of the first and second sense amp control signals YSA1, YSA2 are activated at the high level at all times. Therefore, the first and second memory blocks BLOCK1, BLOCK2 are simultaneously enabled.

Consequently, both of the first and second sense amp units 104-1, 104-2 of the first memory block BLOCK1 are driven and respectively amplify 8-bit data, thus total outputting 16-bit data, and simultaneously with the operation of the first memory block BLOCK2 the third and fourth sense amp units 104-3, 104-4 of the second memory block BLOCK2 are all driven and respectively amplify 8-bit data, thus total outputting 16-bit data. Therefore, total 32-bit data are loaded in the data bus DB. Then, according to the data bus DB which is divided into the four parts by the fuses Fuse1–Fuse3, the 32-bit data can be simultaneously inputted/outputted by the first to fourth data input/output units 106-1, 106-2, 106-3,1 106-4, 8-bit data corresponding each data input/output unit.

Thus, in case of applying the embodiment of the present invention for the ×32 I/O system, it is possible to use the memory having the 2K×32 capacity, which solves the problem occurred in the conventional art in which a couple of memory chips, each of which has the ×16 I/O system, are required and connected for the memory of the ×32 I/O system.

In FIG. 5, the ×8, ×16, ×32 I/O system according to the embodiment of the present invention is compared to the conventional art. As shown therein, the conventional memory chip and the memory chip of the present invention which consist of the memory cell of the same size reduce the power consumption of the cell with the identical memory capacity and the same number of address pins in the ×8 and ×16 I/O system. Also, the memory chip according to the embodiment of the present invention can be used as the ×32 I/O system which could not be achieved with a single memory chip in the conventional art.

As described above, the memory chip having the multiple input/output system of the present invention can be easily transformed to various I/O ×8, ×16 and ×32 systems by changing the configuration of the fuses and enable only a necessary memory cell, thus considerably reducing the power consumption of the cell and improving the stability of the circuit.

It will be apparent to those skilled in the art that various modifications and variations can be made in the multiple input/output memory chip of the present invention without departing from the spirit or scope of the invention. Thus, it is intended that the present invention cover the modifications and variations of this invention provided they come within the scope of the appended claims and their equivalents.

What is claimed is:

1. A multiple input/output memory chip which is capable of being used as each of a ×n, ×2n or ×4n I/O system, wherein "n" is a prescribed number of bits, comprising:

a block selecting unit for receiving a source voltage or a column address lowest bit and thereby selectively activating a first block selection signal or a second block selection signal;

a column control unit for receiving a source voltage or a column address lowest bit and thereby selectively activating a first column control signal or a second column control signal;

a first bank for reading or writing each of n-bit or 2n-bit data in accordance with the first or second column control signal and the first block selection signal;

a second bank for reading or writing each of n-bit or 2n-bit in accordance with the first or second column control signal and the second block selection signal; and a data bus coupled to the first bank and the second bank and dividable into up to four parts, wherein based on the first bank and the second bank, the chip is capable of operating as said each of the ×n, ×2n or ×4n I/O system.

2. The multiple input/output memory chip according to claim 1, wherein said block selecting unit activates only the first block selection signal in the ×n I/O system, alternatively activates the first and second block selection signals in the ×2n I/O system and activates both of the first and second block selection signals in the ×4n I/O system.

3. The multiple input/output memory chip according to claim 2, wherein said block selecting unit includes first and second fuses each of which an end is connected to a source voltage, first and second inverters serially connected with the other end of the first fuse, a third fuse of which an end is connected to the column address lowest bit, a third inverter commonly connected to the other ends of the second and third fuses, a fourth fuse of which an end is connected to an output side of the third inverter, a fourth inverter connected to the other end of the fourth fuse and a fifth fuse of which an end is connected to a node between the first fuse and the first inverter and the other end is connected to a node between the fourth fuse and the fourth inverter.

4. The multiple input/output memory chip according to claim 3, wherein in the ×n I/O system, said block selecting unit links the first and fifth fuses and cuts off the second, third and fourth fuses.

5. The multiple input/output memory chip according to claim 3, wherein in the ×2n I/O system, said block selecting unit links the second, third and fourth fuses and cuts off the first and fifth fuses.

6. The multiple input/output memory chip according to claim 3, wherein in the ×4n I/O system, said block selecting unit links the first, second and fourth fuses and cuts off the third and fifth fuses.

7. The multiple input/output memory chip according to claim 1, wherein said column control unit includes first and second fuses each of which an end is connected to the source voltage, fifth and sixth inverters serially connected with the other end of the first fuse, a third fuse of which an end is connected to the column address lowest bit, a seventh inverter commonly connected to the other ends of the second and third fuses, an eighth inverter connected to an output side of the seventh inverter, and a fourth fuse of which an end is connected to a node between the first fuse and the fifth inverter and the other end is connected to a node between the seventh and eighth inverters.

8. The multiple input/output memory chip according to claim 7, wherein in the ×n I/O system, said column control unit links the third and fourth fuses and cuts off the first and second fuses.

9. The multiple input/output memory chip according to claim 7, wherein in the ×2n I/O system, said column control unit links the first and second fuses and cuts off the third and fourth fuses.

10. The multiple input/output memory chip according to claim 7, wherein in the ×4n I/O system, said column control unit links the first and second fuses and cuts off the third and fourth fuses.

11. The multiple input/output memory chip according to claim 1, wherein the first bank comprises:

a memory cell array consisting of a plurality of word lines and a plurality of bit lines;

a row decoder for decoding a row address signal in accordance with the first block selection signal;

a word line driving unit for receiving the decoded address signal and driving a corresponding word line among the plurality of the word lines of the memory cell array;

a first column selecting unit connected to one side of the memory cell array for selecting the n number of bit lines among the plurality of bit lines in accordance with a column address signal;

a second column selecting unit connected to the other side of the memory cell array for selecting the n number of bit lines among the plurality of bit lines in accordance with the column address signal;

a first sense amp unit for amplifying data of the n number of the memory cells selected by the word line driving unit and the first column selecting unit to a predetermined size;

a second sense amp unit for amplifying data of the n number of the memory cells selected by the word line driving unit and the second column selecting unit to a predetermined size;

a sense amp driving unit for driving the first or second sense amp unit in accordance with the first or second column control signal of the column control unit;

first and second data input/output units for respectively performing inputting/outputting n-bit data through the data bus;

a read control unit for applying a data output enable signal to the first and second data input/output units, respectively, in accordance with the first block selection signal of the block selecting unit and a predetermined control signal during the reading operation; and a write control unit for applying a data write enable signal to the first and second data input/output units, respectively, in accordance with the first block selection signal of the block selecting unit and a predetermined control signal during the writing operation.

12. The multiple input/output memory chip according to claim 11, wherein when using ×8 bit, the first bank further comprises:
- a first fuse for cutting off the data output enable signal applied from the read control unit to the second data input/output unit; and
- a second fuse for cutting off the data write enable signal applied from the write control unit to the second data input/output unit.

13. The multiple input/output memory chip according to claim 11, wherein the sense amp driving unit alternately activates the first and second sense amp units in the ×n I/O system and simultaneously activates the first and second sense amp units in the ×2n or ×4n I/O system.

14. The multiple input/output memory chip according to claim 1, wherein the second bank is disabled in the ×n I/O system in accordance with the second block selection signal of the block selecting unit, alternately enabled and disabled in the ×2n I/O system and operated at all times in the ×4n I/O system.

15. The multiple input/output memory chip according to claim 1, wherein the second bank comprises:
- a memory cell array consisting of a plurality of word lines and a plurality of bit lines;
- a row decoder for decoding a row address signal in accordance with the first block selection signal;
- a word line driving unit for receiving the decoded address signal and driving a corresponding word line among the plurality of the word lines of the memory cell array;
- a first column selecting unit connected to one side of the memory cell array for selecting the n number of bit lines among the plurality of bit lines in accordance with a column address signal;
- a second column selecting unit connected to the other side of the memory cell array for selecting the n number of bit lines among the plurality of bit lines in accordance with the column address signal;
- a first sense amp unit for amplifying data of the n number of the memory cells selected by the word line driving unit and the first column selecting unit to a predetermined size;
- a second sense amp unit for amplifying data of the n number of the memory cells selected by the word line driving unit and the second column selecting unit to a predetermined size;
- a sense amp driving unit for driving the first or second sense amp unit in accordance with the first or second column control signal of the column control unit;
- first and second data input/output units for respectively performing inputting/outputting n-bit data through the data bus;
- a read control unit for applying a data output enable signal to the first and second data input/output units, respectively, in accordance with the first block selection signal of the block selecting unit and a predetermined control signal during the reading operation; and
- a write control unit for applying a data write enable signal to the first and second data input/output units, respectively, in accordance with the first block selection signal of the block selecting unit and a predetermined control signal during the writing operation.

16. The multiple input/output memory chip according to claim 15, wherein the sense amp driving unit simultaneously drives the first and second sense amp units in the ×2n or ×4n I/O system.

17. The multiple input/output memory chip according to claim 1, wherein the data bus links all of a first fuse to a third fuse in the ×n I/O system for thereby substantially simultaneously performing inputting/outputting n-bit data for the two sub-blocks, respectively, of the first bank.

18. The multiple input/output memory chip according to claim 1, wherein the data bus is divided into four parts by cutting off all of a first fuse to a third fuse in the ×4n I/O system for thereby substantially simultaneously performing inputting/outputting 4n-bit data.

19. A multiple input/output memory chip which is capable of being used as each of a ×n, ×2n or ×4n I/O system, wherein "n" is a prescribed number of bits, comprising:
- a block selecting unit for receiving a source voltage or a column address bit and thereby selectively activating a first block selection signal or a second block selection signal;
- a column control unit for receiving a source voltage or a column address lowest bit and thereby selectively activating a first column control signal or a second column control signal;
- a first bank for substantially simultaneously reading or writing each of n-bit or 2n-bit data in accordance with the first or second column control signal and the first block selection signal;
- a second bank for substantially simultaneously reading or writing each of n-bit or 2n-bit data in accordance with the first or second column control signal and the second block selection signal; and
- a data bus which is connected with first to third fuses and thereby dividable into up to four parts, wherein said column control unit alternately activates the first and second column control signals in accordance with the column address lowest bit in the ×n I/O system and activates both of the first and second column control signals in the ×2n or ×4n I/O system.

20. The chip of claim 19, wherein the first bank comprises:
- a memory cell array consisting of a plurality of word lines and a plurality of bit lines;
- a row decoder for decoding a row address signal in accordance with the first block selection signal;
- a word line driving unit for receiving the decoded address signal and driving a corresponding word line among the plurality of the word lines of the memory cell array;
- a first column selecting unit coupled to one side of the memory cell array for selecting the n number of bit lines among the plurality of bit lines in accordance with a column address signal;
- a second column selecting unit coupled to the other side of the memory cell array for selecting n number of bit lines among the plurality of bit lines in accordance with the column address signal;
- a first sense amp unit for amplifying data of the n number of the memory cells selected by the word line driving unit and the first column selecting unit to a predetermined size;
- a second sense amp unit for amplifying data of the n number of the memory cells selected by the word line driving unit and the second column selecting unit to a predetermined size;
- a sense amp driving unit for driving the first or second sense amp unit in accordance with the first or second column control signal of the column control unit;
- first and second data input/output units for respectively performing inputting/outputting n-bit data through the data bus;

a read control unit for applying data output enable signal to the first and second data input/output units, respectively, in accordance with the first block selection signal of the block selecting unit and a predetermined control signal during the reading operation; and a write control unit for applying a data write enable signal to the first and second data input/output units, respectively, in accordance with the first block selection signal of the block selecting unit and a predetermined control signal during the writing operation, wherein when using an ×8 bit, the first bank further comprises, a first fuse for cutting off the data output enable signal applied from the read control unit to the second data input/output unit; and a second fuse for cutting off data write enable signal applied from the write control unit to the second data input/output unit, wherein the sense amp driving unit alternately activates the first and second sense amp units in the ×n I/O system and simultaneously activates the first and second sense amp units in the ×2n or ×4n I/O system.

21. A multiple input/output memory chip which is capable of being used as each of a ×n, ×2n or ×4n I/O system wherein "n" is a prescribed number of bits, comprising:

a block selecting unit for receiving a source voltage or a column address bit and thereby selectively activating a first block selection signal or a second block selection signal;

a column control unit for receiving a source voltage or a column address lowest bit and thereby selectively activating a first column control signal or a second column control signal;

a first bank for substantially simultaneously reading or writing each of n-bit or 2n-bit data in accordance with the first or second column control signal and the first block selection signal;

a second bank for substantially simultaneously reading or writing each of n-bit or 2n-bit data in accordance with the first or second column control signal and the second block selection signal; and a data bus which is connected with first to third fuses and thereby dividable into up to four parts, wherein the data bus cuts off the first fuse and third fuses in the ×2n I/O system for thereby substantially simultaneously performing inputting/outputting 2n-bit data for each bank.

22. The chip of claim 21, wherein the first bank comprises:

a memory cell array consisting of a plurality of word lines and a plurality of bit lines;

a row decoder for decoding a row address signal in accordance with the first block selection signal;

a word line driving unit for receiving the decoded address signal and driving a corresponding word line among the plurality of word lines of the memory cell array;

a first column selecting unit coupled to one side of the memory cell array for selecting the n number of bit lines among the plurality of bit lines in accordance with a column address signal;

a second column selecting unit coupled to the other side of the memory cell array for selecting n number of bit lines among the plurality of bit lines in accordance with the column address signal;

a first sense amp unit for amplifying data of the n number of the memory cells selected by the word line driving unit and the first column selecting unit to a predetermined size;

a second sense amp unit for amplifying data of the n number of the memory cells selected by the word line driving unit and the second column selecting unit to a predetermined size;

a sense amp driving unit for driving the first or second sense amp unit in accordance with the first or second column control signal of the column control unit;

first and second data input/output units for respectively performing inputting/outputting n-bit data through the data bus;

a read control unit for applying data output enable signal to the first and second data input/output units, respectively, in accordance with the first block selection signal of the block selecting unit and a predetermined control signal during the reading operation; and a write control unit for applying a data write enable signal to the first and second data input/output units, respectively, in accordance with the first block selection signal of the block selecting unit and a predetermined control signal during the writing operation, wherein when using an ×8 bit, the first bank further comprises, a first fuse for cutting off the data output enable signal applied from the read control unit to the second data input/output unit; and a second fuse for cutting off the data write enable signal applied from the write control unit to the second data input/output unit, wherein the sense amp driving unit alternately activates the first and second sense amp units in the ×n I/O system and simultaneously activates the first and second sense amp units in the ×2n or ×4n I/O system.

* * * * *